US012804920B2

(12) United States Patent
Mazzillo et al.

(10) Patent No.: US 12,804,920 B2
(45) Date of Patent: Nov. 17, 2026

(54) WIDE BAND-GAP MPS DIODE AND METHOD OF MANUFACTURING THE SAME

(71) Applicant: NEXPERIA B.V., Nijmegen (NL)

(72) Inventors: Massimo Cataldo Mazzillo, Hamburg (DE); Joachim Stache, Nijmegen (NL); Surabhi Lodha, Nijmegen (NL); Wolfgang Schnitt, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 805 days.

(21) Appl. No.: 17/895,265

(22) Filed: Aug. 25, 2022

(65) Prior Publication Data

US 2023/0060216 A1 Mar. 2, 2023

(51) Int. Cl.
*H10D 62/84* (2025.01)
*H10D 8/01* (2025.01)
(Continued)

(52) U.S. Cl.
CPC ............... *H10D 8/60* (2025.01); *H10D 8/051* (2025.01); *H10D 8/50* (2025.01);
(Continued)

(58) Field of Classification Search
CPC .. H10D 8/60–605; H10D 8/051; H10D 8/045; H10D 8/50; H10D 8/411; H10D 8/422; H10D 8/00–825; H10D 8/041; H10D 62/8325; H10D 62/8503; H10D 64/01; H10D 64/64; H10D 62/126; H10D 62/60; H10D 62/106; H10D 62/102; H10D 62/124; H10D 88/00; H10D 88/101;
(Continued)

(56) References Cited

U.S. PATENT DOCUMENTS

2012/0228636 A1* 9/2012 Maeyama ............ H10D 62/106 257/77
2012/0241762 A1* 9/2012 Noda ....................... H10D 8/60 257/77

(Continued)

FOREIGN PATENT DOCUMENTS

EP 3792980 A1 3/2021
JP 2013254858 A 12/2013

OTHER PUBLICATIONS

Extended European Search Report for corresponding European application EP21193038.3 14 pages dated May 13, 2022.

*Primary Examiner* — Moin M Rahman
(74) *Attorney, Agent, or Firm* — Ruggiero McAllister & McMahon LLC

(57) ABSTRACT

The present disclosure relates to a wide band-gap merged p-i-n/Schottky, MPS, diode, and to a method of manufacturing the same. The present disclosure particularly relates to Silicon Carbide, SiC, MPS diodes. According to the present disclosure, the MPS diode includes different Schottky contacts with different IV characteristics, and/or ohmic contacts with a different contact resistance and/or threshold voltage. This allows the conduction area of the MPS diode to change more gradually with forward bias thereby avoiding drawbacks associated with a large conduction area when switching from a forward biasing mode to a reverse biasing mode. Therefore, the dynamic switching performance can be improved in a wide operation voltage range.

20 Claims, 9 Drawing Sheets

(51) Int. Cl.

| | |
|---|---|
| ***H10D 8/50*** | (2025.01) |
| ***H10D 8/60*** | (2025.01) |
| ***H10D 62/832*** | (2025.01) |
| ***H10D 62/85*** | (2025.01) |
| ***H10D 64/01*** | (2025.01) |
| ***H10D 64/64*** | (2025.01) |

(52) U.S. Cl.
CPC ..... *H10D 62/8325* (2025.01); *H10D 62/8503* (2025.01); *H10D 64/01* (2025.01); *H10D 64/64* (2025.01)

(58) Field of Classification Search
CPC ......... H10D 84/983–988; H10D 88/01; H10B 20/40–65; H10B 53/20; H10B 41/20–27; H10B 43/20–27; H10B 51/20; H10B 63/84–845
See application file for complete search history.

(56) References Cited

U.S. PATENT DOCUMENTS

| | | | | |
|---|---|---|---|---|
| 2013/0032809 | A1 | 2/2013 | Allen et al. | |
| 2021/0036166 | A1 | 2/2021 | Yu et al. | |
| 2022/0020884 | A1* | 1/2022 | Rascuná .................. | H10D 8/60 |

* cited by examiner

WIDE BAND-GAP MPS DIODE AND METHOD OF MANUFACTURING THE SAME

CROSS REFERENCE TO RELATED APPLICATION

This application claims the benefit under 35 U.S.C. § 119(a) of European Application No. 21193038.3 filed Aug. 25, 2021, the contents of which are incorporated by reference herein in their entirety.

BACKGROUND OF THE DISCLOSURE

1. Field of the Disclosure

The present disclosure relates to a wide band-gap merged p-i-n/Schottky, MPS, diode, and to a method of manufacturing the same. The present disclosure particularly relates to Silicon Carbide, SiC, MPS diodes.

2. Description of the Related Art

SiC MPS diodes show great potential for switching power supply applications. An example of a known SiC diode 1 is shown in FIG. 1. Known diode 1 comprises a SiC semiconductor body having an active area 7. In FIG. 1, the semiconductor body comprises an n+ substrate 2 on which an n− epitaxial layer 3 has been grown. Active area 7 comprises a plurality of non-overlapping p+ contact regions 4 formed by means of ion implantation and an n− remaining region. Diode 1 further comprises a p− junction extension region 5, a passivation layer 6, and a passivation layer 9. Active area 7 corresponds to the part of epitaxial layer 3 that contributes to the current flow during reverse and/or forward operation of diode 1.

Diode 1 comprises a plurality of contacts of a first type, each contact of the first type being a Schottky contact with the remaining region. The plurality of contacts of the first type comprises a first set of contacts of which each contact is defined by a first Schottky barrier height. In FIG. 1, the first set of contacts is formed using a first metallization 8 that makes a Schottky contact with the remaining region.

In addition, diode 1 comprises a plurality of contacts of a second type, each contact of the second type being an Ohmic contact with a respective doped contact region 4. These respective doped contact regions form respective PN junctions with the remaining region that have a first threshold voltage. The plurality of contacts of the second type comprises a second set of contacts of which each contact has a first Ohmic contact resistance. In FIG. 1, the second set of contacts is formed using a second metallization 10 that makes an Ohmic contact with the remaining region. As shown, the plurality of contacts of the first type and the plurality of contacts of the second type are electrically connected.

Diode 1 combines the best features of both Schottky and PiN diodes to obtain a low on-state voltage drop, low leakage in the off-state, fast switching, and good high temperature characteristics.

The problem of creating optimal Schottky and p+ ohmic contacts in SiC MPS diodes is well known. It is of crucial importance to guarantee low static power losses, which depend on the Schottky barrier height, and at the same time guarantee a good surge current capability, which depends on the ohmic contact characteristics between second metallization 10 and doped contact regions 4.

Known SiC MPS are operable in a so-called Schottky conduction mode, hereinafter referred to as the first forward mode, for low forward bias (<~2V). In this mode, a current through the first set of contacts corresponds to at least a majority of a forward current through the MPS diode. Known SiC MPS are further operable in a so-called PN conduction mode, hereinafter referred to as the second forward mode, for high forward bias (>~4V). In this mode, a current through the contacts of the first type and the second set of contacts corresponds to at least a majority of the forward current through the MPS diode.

In known MPS diodes operating in the first forward mode, the whole Schottky contact region is active from low to high forward currents. Therefore, the switching to reverse mode operation is strongly affected by the large Schottky conduction area. This leads to higher leakage currents, higher recovery charge, and slower switching time during the dynamic reverse bias switching. All these parameters depend in fact on the MPS conduction area under forward voltage.

Likewise, when operating in the second forward mode, the whole PN junction area is active in the whole surge current operation range with consequent degradation of the reverse switching performance from low surge current events. This can also have an impact on the thermal dissipation capability of the device for high conduction currents.

SUMMARY

An object of the present disclosure is to provide a MPS diode in which the abovementioned problems do not occur or at least to a lesser extent.

According to the present disclosure this object is achieved using an MPS diode as defined in claim 1 that is characterized that the plurality of contacts of the first type further comprises a third set of contacts of which each contact is defined by a second Schottky barrier height higher than the first Schottky barrier height, and/or in that the plurality of contacts of the second type further comprises a fourth set of contacts a) wherein the PN junctions associated with the doped contact regions with which the fourth set of contacts are Ohmic contacts have a second threshold voltage and wherein the PN junctions associated with the doped contact regions with which the second set of contacts are Ohmic contacts have a first threshold voltage that is lower than the second threshold voltage, and/or b) of which each contact has a second Ohmic contact resistance higher than the first Ohmic contact resistance.

The third set of contacts and/or the fourth set of contacts allows for a modulation of the conduction area of the diode, i.e. to change the size of the conduction area as a function of forward bias. According to the present disclosure, the conduction area changes more gradually with forward bias thereby avoiding the abovementioned drawbacks associated with a large conduction area when switching from a forward biasing mode to a reverse biasing mode. Therefore, the dynamic switching performance can be improved in a wide operation voltage range.

For example, the MPS diode can be configured to be operable, with increasing forward voltage over the MPS diode, in a first forward mode, an optional additional first forward mode, a second forward mode, and an optional additional second forward mode. At least one of the additional first forward mode and the additional second forward mode is available.

In the first forward mode, a current through the first set of contacts corresponds to at least a majority of a forward current through the MPS diode. In the additional first forward mode, which applies when the plurality of contacts of the first type further comprises the third set of contacts, a current through the first and third sets of contacts corresponds to at least a majority of the forward current through the MPS diode. In the second forward mode, a current through the contacts of the first type and the second set of contacts corresponds to at least a majority of the forward current through the MPS diode. In the additional second forward mode, which applies when the plurality of contacts of the second type further comprises a fourth set of contacts, a current through the plurality of contacts of the first and second types corresponds to at least a majority of the forward current through the MPS diode.

The plurality of contacts of the first type and/or the plurality of contacts of the second type can be at least partially formed as a plurality of interdigitated lines, stripes, or bars.

The second Schottky barrier height can be at least 5 percent greater than the first Schottky barrier height, more preferably at least 10 percent. Additionally or alternatively, the second contact resistance can be at least 5 percent greater than the first contact resistance, more preferably at least 10 percent. Additionally or alternatively, the second threshold voltage is at least 5 percent greater than the first threshold voltage, more preferably at least 10 percent.

A dopant concentration of the doped contact regions corresponding to the third set of contacts can be at least 10 percent greater than a dopant concentration of the doped contact regions corresponding to the fourth set of contacts, more preferably at least 20 percent.

Additionally or alternatively, a metallization of the first set of contacts can be different from a metallization of the third set of contacts with respect to one or more parameters out of the group consisting of a type of the metal(s) used, an annealing time used for forming the Schottky contact, and an annealing temperature used for forming the Schottky contact. The metallization of the first set of contacts preferably comprise one or a combination of Aluminum, Al, Titanium, Ti, Molybdenum, Mo, and Tungsten, W, and the metallization of the third set of contacts preferably comprises one or a combination of Ti, Nickel, Ni, gold, Au, and Platinum, Pt.

Additionally or alternatively, a metallization of the second set of contacts can be different from a metallization of the fourth set of contacts with respect to one or more parameters out of the group consisting of a type of the metal(s) used, an annealing time used for forming the Ohmic contact, and an annealing temperature used for forming the Ohmic contact. The metallization of the second set of contacts preferably comprises one or a combination of, Ni, Ti, Al, Silicon, Si, Cobalt, Co, and Nickel Silicide, NiSi, and the metallization of the fourth set of contacts preferably comprises one or a combination of Ti, Titanium Nitride, TiN, Tantalum, Ta, Mo, Palladium, Pd, and Germanium, Ge.

The semiconductor body may comprise a semiconductor substrate of the first charge type and an epitaxial layer of the first charge type grown on the semiconductor substrate, wherein the active area is formed in the epitaxial layer and wherein the plurality of non-overlapping doped contact regions corresponds to a plurality of ion-implanted regions of the second charge type.

The semiconductor substrate may comprise a first surface at which the plurality of contacts of the first type and the plurality of contacts of the second type are formed, and an opposing second surface. In this case, the MPS diode may further comprise a first terminal contact, arranged at or near the first surface and electrically connected to the plurality of contacts of the first type and the plurality of contacts of the second type, and a second terminal contact formed at the second surface. This second terminal contact preferably makes an Ohmic contact with the semiconductor substrate. The first terminal contact preferably forms one of an anode and cathode of the MPS diode and the second terminal contact the other of the anode and cathode of the MPS diode. The semiconductor substrate may comprise a gallium nitride substrate or a silicon carbide substrate.

According to a second aspect, the present disclosure provides a method for manufacturing a wide band-gap merged p-i-n/Schottky, MPS, diode as described above. The method according to the present disclosure comprises the steps of a) providing a wide band-gap semiconductor body having an active area, the active area comprising a plurality of non-overlapping doped contact regions of a second charge type and a remaining region of the first charge type. The method further comprises a step b) of forming a plurality of contacts of a second type, each contact of the second type making an Ohmic contact with a respective doped contact region, wherein said respective doped contact region forms a respective PN junction with the remaining region. Said forming a plurality of contacts of a second type comprises a step b1) of forming a second set of contacts, each contact of the second set of contacts having a first Ohmic contact resistance and the corresponding PN junction having a first threshold voltage.

The method further comprises a step c) of forming a plurality of contacts of a first type, each contact of the first type being a Schottky contact with the remaining region. Said forming a plurality of contacts of a first type comprises a step c1) of forming a first set of contacts of which each contact is defined by a first Schottky barrier height, wherein the plurality of contacts of the first type and the plurality of contacts of the second type are electrically connected.

According to the present disclosure, the step of forming a plurality of contacts of a first type additionally comprises a step c2) of forming a third set of contacts of which each contact is defined by a second Schottky barrier higher than the first Schottky barrier height. Additionally or alternatively, the step of forming a plurality of contacts of a second type further comprises a step b2) of forming a fourth set of contacts, wherein the PN junctions associated with the doped contact regions with which the fourth set of contacts are Ohmic contacts have a second threshold voltage, wherein the PN junctions associated with the doped contact regions with which the second set of contacts are Ohmic contacts have a first threshold voltage that is lower than the second threshold voltage, and/or of which each contact has a second Ohmic contact resistance higher than the first Ohmic contact resistance.

Step b1) may comprise arranging a second metallization on the substrate and subsequently annealing the second metallization using second annealing conditions, and step b2) may comprise arranging a fourth metallization on the substrate and subsequently annealing the fourth metallization using fourth annealing conditions. The second and fourth annealing conditions may each comprise an annealing time and an annealing temperature. The second metallization can be different from the fourth metallization and/or the second annealing conditions can be different from the fourth annealing conditions. The second metallization of the second set of contacts preferably comprises one or a combination of Ni, Ti, Al, Si, Co and NiSi and the fourth metallization of the fourth set of contacts preferably comprises one or a combination of Ti, TiN, Ta, Mo, Pd and Ge. The annealing temperature corresponding to the fourth annealing conditions may be lower than the annealing temperature corresponding to the second annealing conditions.

Step c1) may comprise arranging a first metallization on the substrate and subsequently annealing the first metallization using first annealing conditions, and step c2) may comprise arranging a third metallization on the substrate and subsequently annealing the third metallization using third annealing conditions. The first and third annealing conditions may each comprise an annealing time and an annealing temperature. The first metallization can be different from the third metallization and/or the first annealing conditions can be different from the third annealing conditions. The first metallization of the first set of contacts preferably comprises one or a combination of Al, Ti, Mo, and W, and the third metallization of the third set of contacts preferably comprises one or a combination of Ti, Ni, Au and Pt. The annealing temperature corresponding to the third annealing conditions may be lower than the annealing temperature corresponding to the first annealing conditions. In addition, the annealing temperature corresponding to the fourth annealing conditions may be higher than the annealing temperature corresponding to the first annealing conditions.

The semiconductor body may comprise a semiconductor substrate of the first charge type and an epitaxial layer of the first charge type grown on the semiconductor substrate, wherein the active area is formed in the epitaxial layer and wherein the plurality of non-overlapping doped contact regions corresponds to a plurality of ion-implanted regions of the second charge type. The semiconductor substrate may comprise gallium nitride or silicon carbide.

BRIEF DESCRIPTION OF THE DRAWINGS

Next, the present disclosure will be explained in more detail referring to the appended drawings, wherein identical reference signs will be used to refer to identical or similar components, and wherein.

DETAILED DESCRIPTION

Figure 7:
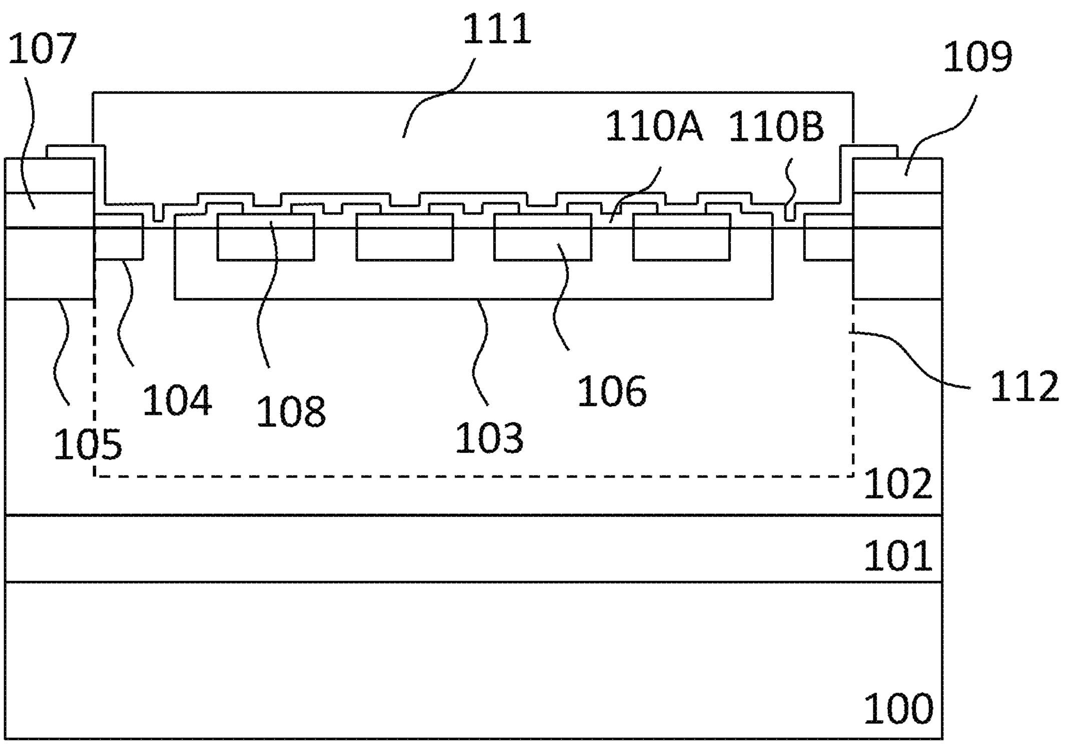
Figure 8:
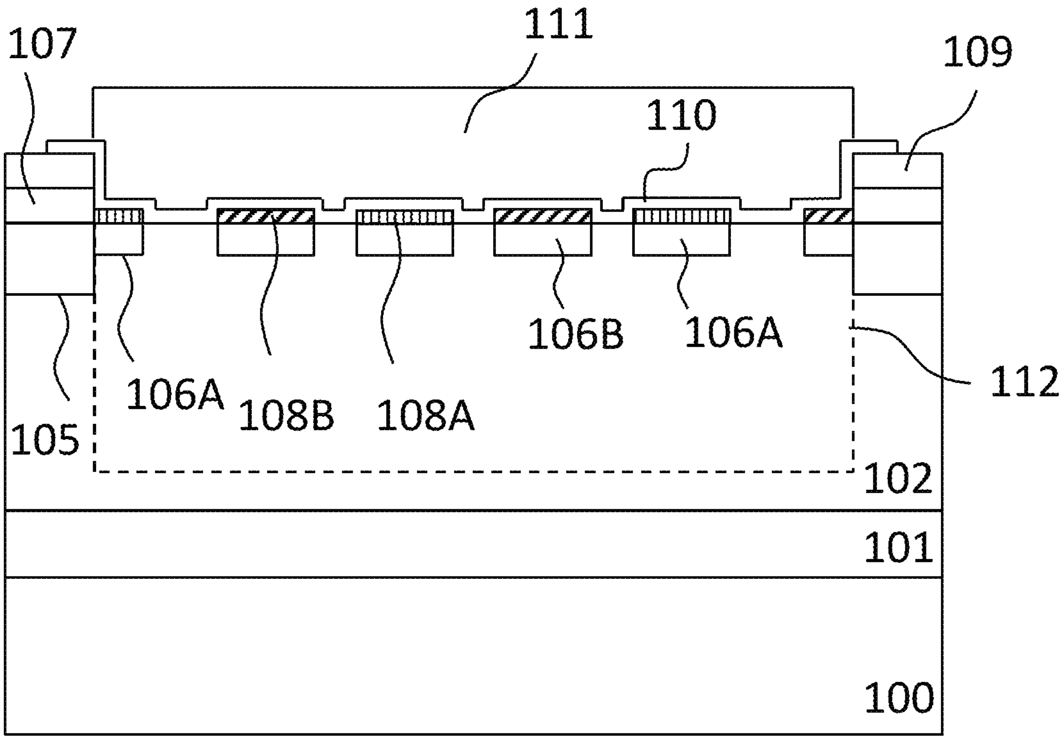
FIG. 8 illustrates a further an embodiment of an MPS diode in accordance with the present disclosure.

FIGS. 7 and 8 illustrate two different embodiment of an MPS diode in accordance with the present disclosure. Here, FIG. 7 illustrates a SiC MPS diode with one set of Ohmic contacts and two different sets of Schottky contacts, and FIG. 8 illustrates a SiC MPS diode with two different sets of Ohmic contacts and one set of Schottky contacts. It should be noted that according to an aspect, the present disclosure relates to an MPS diode with m different sets of Schottky contacts and n different sets of Ohmic contacts, wherein n+m>2.

The SiC MPS diode in FIG. 8 is built on an n-type epitaxial wafer formed by a highly doped n-type substrate 100, which has a thickness of approximately 350 um and a dopant density of about 1E19 cm-3. On substrate 100, an n-type doped buffer layer 101 is grown having a thickness of about 1 um, and a dopant density of about 1E18 cm-3. A lowly doped n-type drift layer 102 with a thickness of about 4 to 12 um and a dopant concentration of about 5E15 to 5E16 cm-3 has been grown on buffer layer 101. P-type doped wells 106A, 106B have been created by means of ion implantation in drift layer 102 thereby defining MPS active area 112.

P-type doped wells 106A, 106B are physically separated in a non-overlapping manner and can be arranged in different layout configurations, for example using an interdigitated contact design. P-type doped wells 106A, 106B have a depth of approximately 0.3 um and different doping values in the range between 1E19-1E20 cm-3. A lowly doped p-type border region 105 surrounds the active area in order to prevent edge breakdown. It can have a depth of about 1 um and a dopant concentration in the range between 1E16-1E17 cm-3. Border region 105 overlaps the outer implanted wells 106A in active area 112.

A double passivation layer has been deposited on the surface in border region 105. It includes a first passivation layer 107, for example a TEOS layer with a thickness of about 1 um, and a second passivation layer 109, for example Silicon Nitride, with a thickness of about 1 um and overlying first passivation layer 107.

FIG. 8 also depicts a first patterned ohmic contact metal layer 108A, for example NiSi, overlying wells 106A and forming a first set of ohmic contacts. In addition, the MPS diode in FIG. 8 further comprises a second patterned ohmic contact metal layer 108B, for example NiSi, overlying wells 106B. Both ohmic contacts can have a thickness of about 200 nm. The first and second sets of ohmic contacts have different contact resistances and thus different conductivity characteristics.

A Ti/TiN layer 110 having a thickness of about 100 nm/100 nm overlies the first and second sets of ohmic contacts in the active area. Layer 110 contacts the surface of the epitaxial layer in the active area and forms a Schottky contact. An Al layer 111, for example 4 um thick, overlies Ti/TiN layer 110.

The MPS diode in FIG. 8 also includes a back metal layer that is not shown in the figure. The back metal layer deposited on the bottom of substrate 100 can be formed for example by a NiSi metal barrier of about 200 nm thick and a Ti/Ni/Ag metal layer stack with thicknesses of about 100 nm/500 nm/1 um. These metal layers can be deposited sequentially after substrate grinding to a thickness of about 110 um.

The MPS diode in FIG. 8 can also include the following elements that are not shown in the figure. An n-type doped enrichment layer may have been implanted on the surface of the epitaxial layer in active area region 112. This layer can have a thickness of about 1 um and a dopant density of approximately 1E16 cm-3. Additionally or alternatively, a polyimide layer of for example 10 um thick can be overlying second passivation layer 109 and the outer region of Al metal layer 111.

The MPS diode in FIG. 7 is manufactured on a similar semiconductor body as the MPS diode in FIG. 8. An n-type doped enrichment layer 103 is implanted on the surface of the epitaxial layer in the active area region. Layer 103 can have a thickness of about 1 um and a dopant density of approximately 1E16-1E17 cm-3. Enrichment layer 103 has a different doping than layer 102. P-type doped wells 106 have been created by implantation in enrichment layer 103 and in layer 102, defining active area 112. Wells 106 can be designed in different layout configurations, for example by using an interdigitated contact design. Wells 106 have a depth of approximately 0.3 um and a dopant density in the range 1E19-1E20 cm-3.

The MPS diode in FIG. 7 includes a p-type doped border region 105 and a double passivation layer 107, 109 with the same characteristics described for the MPS diode in FIG. 8.

The MPS diode in FIG. 7 comprises a patterned ohmic contact metal layer 108, for example NiSi, overlying wells 106 and a first Schottky metal layer 110A, for example Ti, in contact with ohmic contact layer 108 and overlying the n-type doped regions in enrichment layer 103. Both these metal layers may have a thickness of for example 200 nm. A Ti/TiN layer 110B with a thickness of about 100 nm/100 nm overlies ohmic contact layer 108 and first Schottky metal layer 110A in the active area. Layer 110B contacts the surface of the epitaxial layer all around enrichment layer 103 and forms a second Schottky contact. The first and second Schottky contacts have different barrier heights and thus different conductivity characteristics. An Al layer 111, for example 4 um thick, overlies Ti/TiN layer 110B. The structure includes also a back metal layer and/or a polyimide layer with the same characteristics of the MPS diode illustrated in FIG. 8.

Figure 9A:
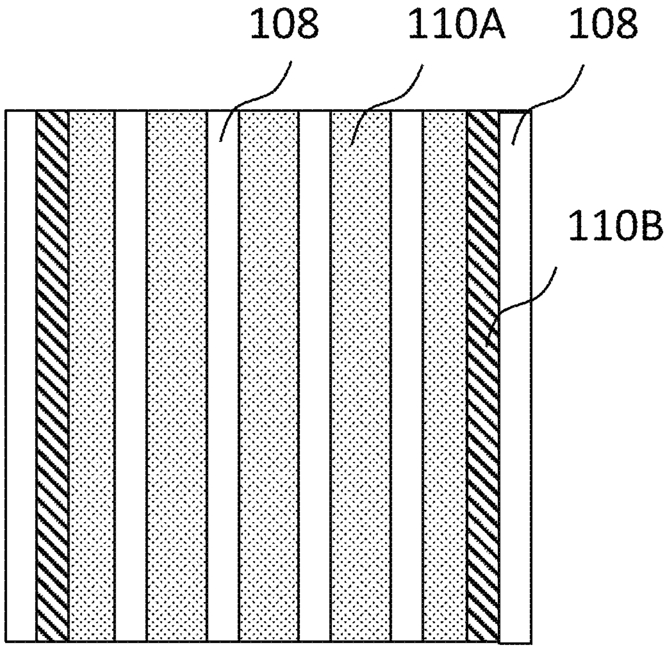
FIGS. 9A and 9B illustrate top views corresponding to the MPS diodes of FIGS. 7 and 8, respectively.
Figure 9B:
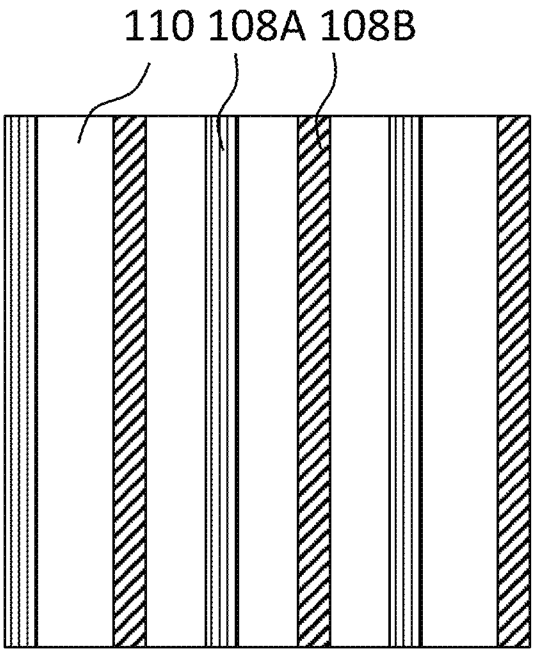

A possible layout for the MPS diodes of FIGS. 7, 8 is shown in FIGS. 9A, 9B, respectively. In FIG. 9B, corresponding to the MPS diode of FIG. 8, Ohmic contact layers 108A, 108B are arranged in the active area in an interdigitated design with width of wells 106 in the range 2-4 um and a spacing in the range 2-8 um. Schottky metal layer 110 occupies the region between adjacent Ohmic contact layers 108A, 108B.

Likewise, a possible layout for the MPS diode of FIG. 7 is shown in FIG. 9A. Also in this case ohmic contact layer 108 has an interdigitated design with the width of wells 106 in the range 2-4 um and a spacing in the range 2-8 um. Second Schottky metal layer 110B is defined only in an external region close to the active area edge while first Schottky metal layer 110A is defined in the central region of active area 112 in the space between adjacent ohmic contact stripes.

The layouts in FIGS. 9A and 9B show only a small part of the active area region and are reported here just for reference. Moreover, it should be noted that several other layouts would be compatible with the MPS diodes in accordance with the present disclosure, such as rectangular, circular, hexagonal contact regions distributed in the MPS active area.

Next, a process flow to integrate the three contacts in the MPS diode shown in FIG. 7 is described with reference to FIGS. 2-7. As a starting point, a semiconductor body is provided having a substrate 100, buffer layer 101, and drift layer 102. Enrichment layer 103, border region 105, and wells 106 are defined in drift layer 102 by using standard implantation processes, e.g. Al implanted impurities for p-type doped layers, and N or P implanted impurities for n-type doped layers.

As a first step, a TEOS passivation layer 107 of about 1 um is deposited. On layer 107, a photoresist layer is applied, which is subsequently patterned using photolithography. Through the openings in the photoresist layer, TEOS layer 107 is etched using dry etching or wet-chemical etching techniques. Thereafter, the photoresist layer is stripped, resulting in the situation shown in FIG. 2.

Figure 1:
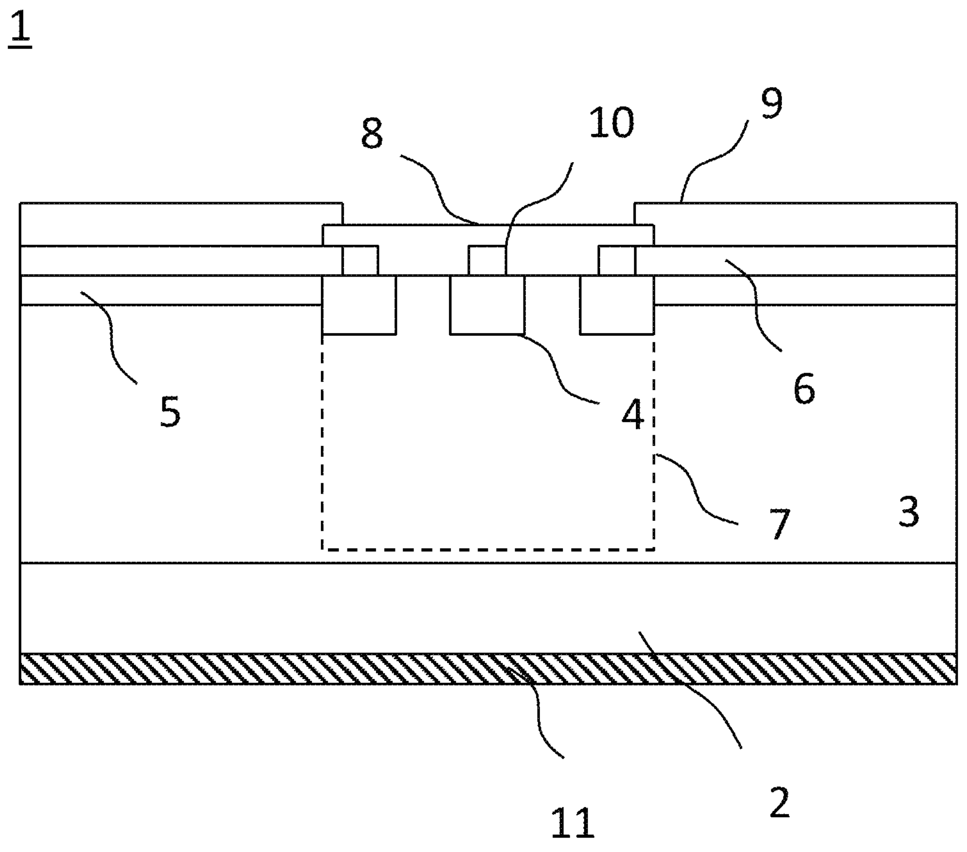
FIG. 1 illustrates a known MPS diode.
Figure 2:
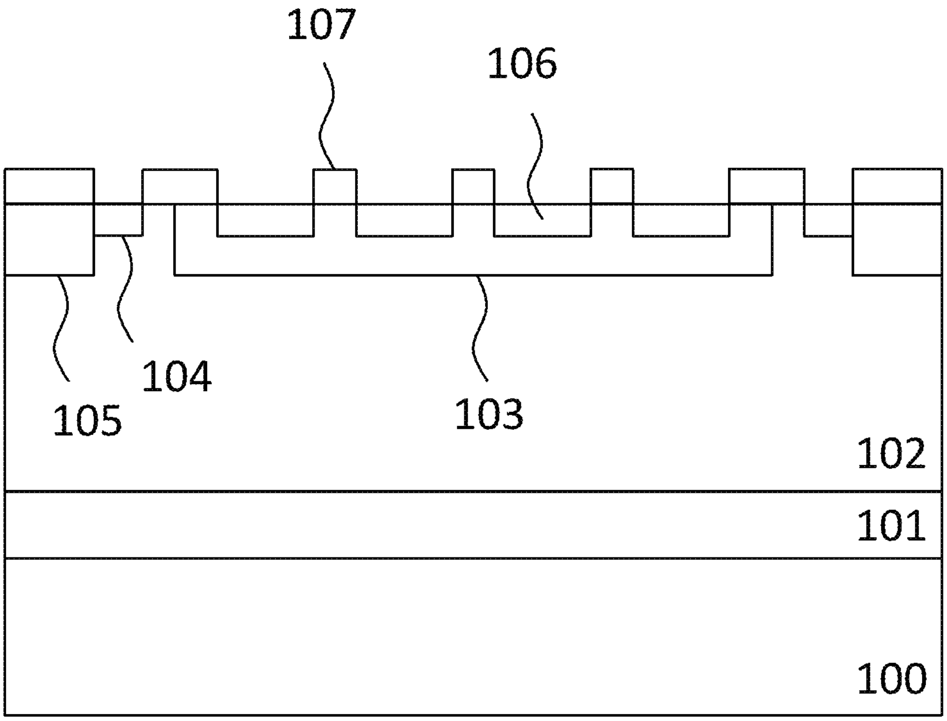
FIGS. 2-7 illustrate a method for manufacturing an embodiment of an MPS diode in accordance with the present disclosure.
Figure 3:
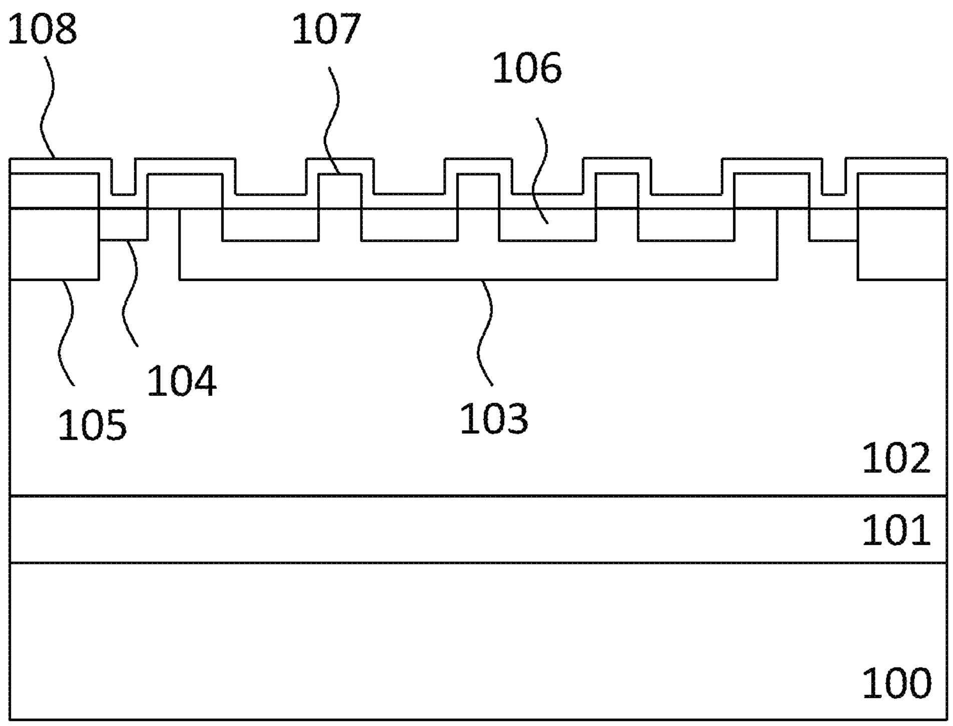

As a next step, a metal layer 108, such as Ni, is deposited with a thickness of 100 nm. This metal layer is subjected to a thermal annealing process for metal layer silicidation and ohmic contact formation. Typically, the annealing is performed for 3 minutes at a temperature between 900 and 1100 degrees Celsius, after which the situation shown in FIG. 3 is obtained.

Figure 4:
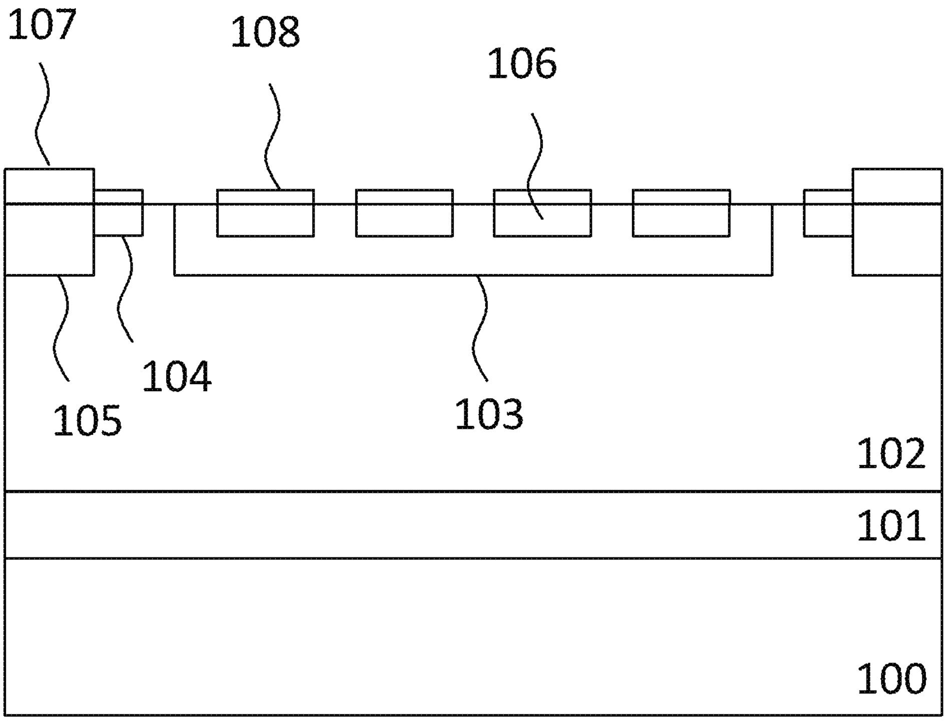

Next, a wet-chemical etching step is performed for removing that part of metal layer 108 that has not reacted with the semiconductor body and that is arranged on TEOS layer 107. Thereafter, a photoresist layer is applied and patterned using photolithography. Through the openings in this photoresist layer, TEOS layer 107 is removed from the active area using a wet-chemical etching process. After stripping the photoresist layer, the situation shown in FIG. 4 is obtained.

Figure 5:
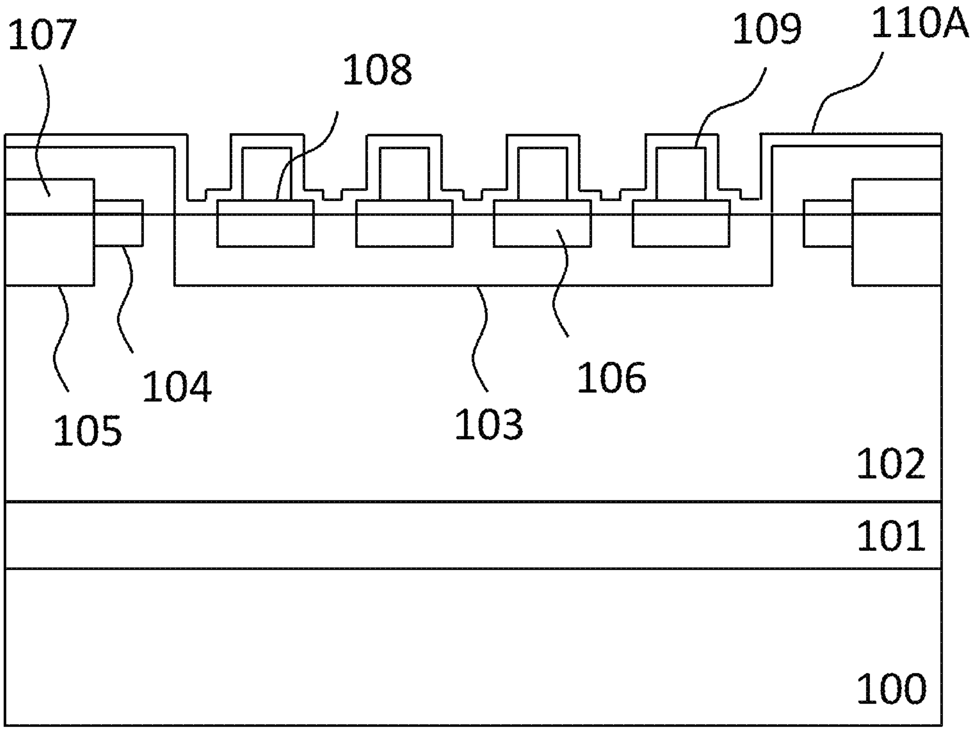

As a next step, a second passivation layer 109 is deposited, e.g. a silicon nitride layer or a TEOS layer, with a thickness of about 1 um. A photoresist layer is applied and patterned using photolithography. A wet-chemical etching step is performed through the openings in the photoresist layer and the photoresist layer is stripped. Thereafter, a metal layer 110A, such as Ti, is deposited with a thickness of 100 nm. This layer is annealed for silicidation and the formation of a first Schottky contact. Typically, the annealing is performed for 3 minutes at a temperature between 550 and 750 degrees Celsius, after which the situation shown in FIG. 5 is obtained.

Figure 6:
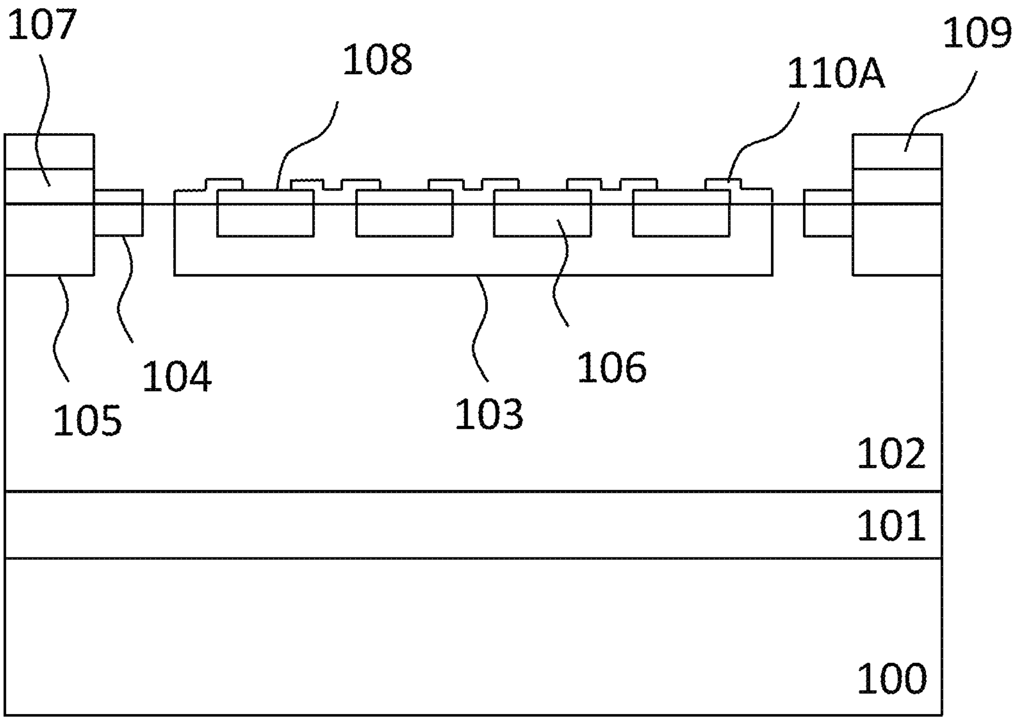

A wet-chemical etching step is performed for removing that part of metal layer 110A that has not reacted with the semiconductor body and that is arranged on second passivation layer 109. Next, a photoresist layer is applied and patterned using photolithography. Through the openings in the photoresist layer, second passivation layer 109 is removed by means of a wet-chemical etching step. Thereafter, the photoresist layer is stripped. After this step, the situation of FIG. 6 is obtained.

As a next step, a metal layer 1106, such as Ti/TiN, is deposited with a thickness of 100 nm/100 nm. To this end, two deposition steps can be performed sequentially. After deposition, a photoresist layer is applied and patterned using photolithography. A dry etching step is performed through the openings in the photoresist layer, thereby removing that part of metal layer 1106 that is arranged on the outer region of second passivation layer 109. Next, metal layer 1106 is annealed for silicidation and the formation of a second Schottky contact. Typically, the annealing is performed for 3 minutes at a temperature above 550 degrees Celsius, but below the temperature that was used for the formation of the first Schottky contact. Next, a thick layer 111 of Al is deposited of about 4 um. A photoresist layer is arranged and patterned using lithography. A wet-chemical etching step is performed through the openings in the photoresist layer for removing part of Al layer 111. Subsequently, the photoresist is stripped thereby arriving at the situation shown in FIG. 7.

The manufacturing method described above may include standard photolithography processes for metal patterning, instead of the self-aligned processes described in the process flow above. Furthermore, the concept of the present disclosure can be extended to whatever number of ohmic and Schottky contacts on SiC with the constraint that the multiple rapid thermal annealing processes used for metal silicides formation have to be performed at decreasing temperatures, from a higher temperature to a lower temperature, in order not to modify the conductivity characteristics of the contacts created at higher temperatures at an earlier stage of the manufacturing flow.

For the formation of ohmic contacts on SiC, Ni, Ti, Al, Mo, Si, Co, and Ge can be used. For the formation of Schottky contacts on n-type doped regions in SiC, Ni, Ti, Al, Mo, W, Au, and Pt can be used. The following temperature ranges may be used for the creation of the contacts with different conductivity characteristics on SiC. For ohmic contacts, an annealing temperature between 900 and 1100 degrees Celsius may be used, for near to ohmic contacts, an annealing temperature between 750 and 900 degrees Celsius, for ideal Schottky contacts, an annealing temperature between 550 and 750 degrees Celsius, and for less ideal Schottky contacts, an annealing temperature lower than 550 Celsius. The annealing time is preferably between 30 s and 3 min. The annealing ambient is inert, and preferably comprises an Ar or N2 atmosphere.

In general, the use of thermal annealing processes at different temperatures allows modulating the conductivity characteristics of Schottky and Ohmic contacts on SiC. This will change the activation voltage of the Schottky junction between metal layers 110A, 1106 and the semiconductor body and the PN ohmic junctions between wells 106 and enrichment layer 103.

The first and second Schottky junctions of the MPS diode of FIG. 7 have a different barrier height and thus a different threshold voltage. For low voltage values, the current can only flow in the Schottky region with lower barrier height and the size of this region is smaller than the geometrical active area of the diode. For higher current values, the second Schottky region with higher barrier height will be also activated.

The dynamic switching performance, from a forward to reverse condition, of an MPS diode depends on the conduction area in forward condition. The lower this area, the faster the switching time, and the smaller the recovery charge and leakage current will be.

In the known diode, the current would flow in any case in the whole geometrical active area, for low and high current values. In the proposed design, the fraction of active area where the current can flow is proportional to the amount of current flowing in the device. Therefore the new MPS structure here proposed offers better switching characteristics for low forward voltage due to the conduction area reduction allowed by the new design.

As a result, the same MPS device can be used with enhanced performance in a wider voltage range, thanks to the modulation capability of the turn-on bias in forward condition.

Likewise the MPS diode of FIG. 8 offers similar advantages to those described for the MPS diode of FIG. 7 in terms of better dynamic switching characteristics from a surge event. This is due to the different threshold voltages of the two PN diodes integrated in the structure and/or the different contact resistances associated with the different ohmic contacts.

In the above, the present disclosure has been explained using detailed embodiments thereof. However, the skilled person will understand that the present disclosure is not limited to these embodiments and that various modifications are possible without deviating from the scope of the present disclosure which is defined by the appended claims and their equivalents.

What is claimed is:

1. A wide band-gap merged p-i-n/Schottky, MPS, diode, comprising:

a wide band-gap semiconductor body having an active area, the active area comprising a plurality of non-overlapping doped contact regions of a second charge type and a remaining region of a first charge type different from the second charge type;

a plurality of contacts of a first type, each contact of the first type being a Schottky contact with the remaining region, the plurality of contacts of the first type comprising a first set of contacts of which each contact is defined by a first Schottky barrier height;

a plurality of contacts of a second type, each contact of the second type being an Ohmic contact with a respective doped contact region, wherein the respective doped contact region forms a respective PN junction with the remaining region, the plurality of contacts of the second type comprising a second set of contacts, each contact of the second set of contacts having a first Ohmic contact resistance and a corresponding PN junction having a first threshold voltage;

wherein the plurality of contacts of the first type and the plurality of contacts of the second type are electrically connected; and wherein the plurality of contacts of the first type further comprises a third set of contacts of which each contact is defined by a second Schottky barrier height that is higher than the first Schottky barrier height.

2. The MPS diode according to claim 1, wherein the plurality of contacts of the second type further comprises a fourth set of contacts:

wherein the PN junctions associated with the doped contact regions with which the fourth set of contacts are Ohmic contacts have a second threshold voltage;

wherein the PN junctions associated with the doped contact regions with which the second set of contacts are Ohmic contacts have a first threshold voltage that is lower than the second threshold voltage, wherein each contact of the fourth set of contacts has a second Ohmic contact resistance higher than the first Ohmic contact resistance of the second set of contacts, wherein the MPS diode is configured to be operable in, with increasing forward voltage over the MPS diode;

a first forward mode, wherein in the first forward mode, a current through the first set of contacts corresponds to at least a majority of a forward current through the MPS diode;

an additional first forward mode following the first forward mode, provided the plurality of contacts of the first type further comprises a third set of contacts, wherein in the additional first forward mode, a current through the first and third sets of contacts corresponds to at least a majority of the forward current through the MPS diode;

a second forward mode following the additional first forward mode if applicable and otherwise following the first forward mode, wherein in the second forward mode, a current through the contacts of the first type and the third set of contacts corresponds to at least a majority of the forward current through the MPS diode;

an additional second forward mode following the second forward mode, wherein the plurality of contacts of the second type further comprise a fourth set of contacts, wherein in the additional second forward mode, a current through the plurality of contacts of the first and second types corresponds to at least a majority of the forward current through the MPS diode; and wherein at least one of the additional first forward mode and the additional second forward mode is available.

3. The MPS diode according to claim 1, wherein the plurality of contacts of the first type and/or the plurality of contacts of the second type are at least partially formed as a plurality of interdigitated lines, stripes, or bars.

4. The MPS diode according to claim 1, wherein the plurality of contacts of the second type further comprises a fourth set of contacts:

wherein the PN junctions associated with the doped contact regions with which the fourth set of contacts are Ohmic contacts have a second threshold voltage;

wherein the PN junctions associated with the doped contact regions with which the second set of contacts are Ohmic contacts have a first threshold voltage that is lower than the second threshold voltage, wherein each contact of the fourth set of contacts has a second Ohmic contact resistance higher than the first Ohmic contact resistance of the second set of contacts, wherein the second Schottky barrier height is at least 5 percent greater than the first Schottky barrier height; and/or wherein the second contact resistance is at least 5 percent greater than the first contact resistance; and/or wherein the second threshold voltage is at least 5 percent greater than the first threshold voltage.

5. The MPS diode according to claim 1, wherein the plurality of contacts of the second type further comprises a fourth set of contacts:

wherein the PN junctions associated with the doped contact regions with which the fourth set of contacts are Ohmic contacts have a second threshold voltage;

wherein the PN junctions associated with the doped contact regions with which the second set of contacts are Ohmic contacts have a first threshold voltage that is lower than the second threshold voltage, wherein each contact of the fourth set of contacts has a second Ohmic contact resistance higher than the first Ohmic contact resistance of the second set of contacts, and wherein the doped contact regions corresponding to the third set of contacts have a dopant concentration that is at least 10 percent greater than a dopant concentration of the contact regions corresponding to the fourth set of contacts.

6. The MPS diode according to claim 1, wherein the plurality of contacts of the second type further comprises a fourth set of contacts:

wherein the PN junctions associated with the doped contact regions with which the fourth set of contacts are Ohmic contacts have a second threshold voltage, wherein the PN junctions associated with the doped contact regions with which the second set of contacts are Ohmic contacts have a first threshold voltage that is lower than the second threshold voltage, and wherein each contact of the fourth set of contacts has a second Ohmic contact resistance higher than the first Ohmic contact resistance of the second set of contacts, wherein the first set of contacts has a metallization that is different from a metallization of the third set of contacts with respect to one or more parameters out of the group consisting of a type of the metal(s) used, an annealing time used for forming the Schottky contact, and an annealing temperature used for forming the Schottky contact;

wherein the metallization of the first set of contacts comprises at least one element selected from the group consisting of Al, Ti, Mo, and W;

wherein the metallization of the third set of contacts comprises at least one element selected from the group consisting of Ti, Ni, Au and Pt;

wherein the second set of contacts has a metallization that is different from a metallization of the fourth set of contacts with respect to one or more parameters out of the group consisting of a type of the metal(s) used, an annealing time used for forming the Ohmic contact, and an annealing temperature used for forming the Ohmic contact;

wherein the metallization of the second set of contacts comprises at least one material selected from the group consisting of Ni, Ti, Al, Si, Co and NiSi;

wherein the metallization of the fourth set of contacts comprises at least one element selected from the group consisting of Ti, TIN, Ta, Mo, Pd and Ge.

7. The MPS diode according to claim 1, wherein the semiconductor body comprises a semiconductor substrate of the first charge type and an epitaxial layer of the first charge type grown on the semiconductor substrate, wherein the active area is formed in the epitaxial layer and wherein the plurality of non-overlapping doped contact regions correspond to a plurality of ion-implanted regions of the second charge type.

8. The MPS diode according to claim 7, wherein the semiconductor substrate comprises a first surface at which the plurality of contacts of the first type and the plurality of contacts of the second type are formed, and an opposing second surface, the MPS diode further comprising:

a first terminal contact, arranged at or near the first surface and electrically connected to the plurality of contacts of the first type and the plurality of contacts of the second type;

a second terminal contact formed at the second surface;

wherein the first terminal contact forms one of an anode and cathode of the MPS diode and the second terminal contact another of the anode and cathode of the MPS diode.

9. The MPS diode according to claim 7, wherein the semiconductor substrate comprises gallium nitride or silicon carbide.

10. A method for manufacturing a wide band-gap merged p-i-n/Schottky, MPS, diode as defined in claim 1, comprising the steps of:

a) providing a wide band-gap semiconductor substrate having an active area, the active area comprising a plurality of non-overlapping doped contact regions of a second charge type and a remaining region of the first charge type;

b) forming a plurality of contacts of a second type, each contact of the second type making an Ohmic contact with a respective doped contact region, wherein the respective doped contact region forms a respective PN junction with the remaining region, the forming a plurality of contacts of a second type comprising:

b1) forming a second set of contacts, each contact of the second set of contacts having a first Ohmic contact resistance and the corresponding PN junction having a first threshold voltage;

c) forming a plurality of contacts of a first type, each contact of the first type being a Schottky contact with the remaining region, and comprising:

c1) forming a first set of contacts of which each contact is defined by a first Schottky barrier height, wherein the plurality of contacts of the first type and the plurality of contacts of the second type are electrically connected; and wherein the step of forming a plurality of contacts of a first type additionally comprises:

b2) forming a second set of contacts of which each contact is defined by a second Schottky barrier height higher than the first Schottky barrier height.

11. The method according to claim 10, wherein the step of forming a plurality of contacts of a second type additionally comprises:

c2) forming a fourth set of contacts, wherein the PN junctions associated with the doped contact regions with which the fourth set of contacts are Ohmic contacts have a second threshold voltage, wherein the PN junctions associated with the doped contact regions with which the second set of contacts are Ohmic contacts have a first threshold voltage that is lower than the second threshold voltage, wherein each contact of the fourth set of contacts has a second Ohmic contact resistance higher than the first Ohmic contact resistance of the second set of contacts;

wherein step b1) comprises arranging a second metallization on the substrate and subsequently annealing the second metallization using second annealing conditions, and wherein step b2) comprises arranging a fourth metallization on the substrate and subsequently annealing the fourth metallization using fourth annealing conditions;

wherein the second and fourth annealing conditions each comprise an annealing time and an annealing temperature;

wherein the second metallization is different from the fourth metallization and/or wherein the second annealing conditions are different from the fourth annealing conditions;

wherein the second metallization of the second set of contacts comprises at least one material selected from the group consisting of Ni, Ti, Al, Si, Co and NiSi;

wherein the fourth metallization of the fourth set of contacts comprises at least one element selected from the group consisting of Ti, TIN, Ta, Mo, Pd and Ge;

wherein the annealing temperature corresponding to the fourth annealing conditions is lower than the annealing temperature corresponding to the second annealing conditions.

12. The method according to claim 10, wherein the step of forming a plurality of contacts of a second type additionally comprises:

c2) forming a fourth set of contacts, wherein the PN junctions associated with the doped contact regions with which the fourth set of contacts are Ohmic contacts have a second threshold voltage, wherein the PN junctions associated with the doped contact regions with which the second set of contacts are Ohmic contacts have a first threshold voltage that is lower than the second threshold voltage, wherein each contact of the fourth set of contacts has a second Ohmic contact resistance higher than the first Ohmic contact resistance of the second set of contacts;

step c1) comprises arranging a first metallization on the substrate and subsequently annealing the first metallization using first annealing conditions, and wherein step c2) comprises arranging a third metallization on the substrate and subsequently annealing the third metallization using third annealing conditions;

wherein the first and third annealing conditions each comprises an annealing time and an annealing temperature;

wherein the first metallization is different from the third metallization and/or wherein the first annealing conditions are different from the third annealing conditions;

wherein the first metallization of the first set of contacts comprises at least one element selected from the group consisting of Al, Ti, Mo, and W; and wherein the third metallization of the third set of contacts comprises at least one element selected from the group consisting of Ti, Ni, Au and Pt.

13. The method according to claim 10, wherein the semiconductor body comprises a semiconductor substrate of the first charge type and an epitaxial layer of the first charge type grown on the semiconductor substrate, wherein the active area is formed in the epitaxial layer and wherein the plurality of non-overlapping doped contact regions corresponds to a plurality of ion-implanted regions of the second charge type.

14. The method according to claim 11, wherein the step of forming a plurality of contacts of a second type additionally comprises:

c2) forming a fourth set of contacts, wherein the PN junctions associated with the doped contact regions with which the fourth set of contacts are Ohmic contacts have a second threshold voltage, wherein the PN junctions associated with the doped contact regions with which the second set of contacts are Ohmic contacts have a first threshold voltage that is lower than the second threshold voltage, wherein each contact of the fourth set of contacts has a second Ohmic contact resistance higher than the first Ohmic contact resistance of the second set of contacts;

step c1) comprises arranging a first metallization on the substrate and subsequently annealing the first metallization using first annealing conditions, and wherein step c2) comprises arranging a third metallization on the substrate and subsequently annealing the third metallization using third annealing conditions;

wherein the first and third annealing conditions each comprises an annealing time and an annealing temperature;

wherein the first metallization is different from the third metallization and/or wherein the first annealing conditions are different from the third annealing conditions;

wherein the first metallization of the first set of contacts comprises at least one element selected from the group consisting of Al, Ti, Mo, and W; and wherein the third metallization of the third set of contacts comprises at least one element selected from the group consisting of Ti, Ni, Au and Pt.

15. The method according to claim 11, wherein the annealing temperature corresponding to the fourth annealing conditions is higher than the annealing temperature corresponding to the first annealing conditions.

16. The method according to claim 11, wherein the semiconductor body comprises a semiconductor substrate of the first charge type and an epitaxial layer of the first charge type grown on the semiconductor substrate, wherein the active area is formed in the epitaxial layer and wherein the plurality of non-overlapping doped contact regions corresponds to a plurality of ion-implanted regions of the second charge type.

17. The method according to claim 12, wherein the semiconductor body comprises a semiconductor substrate of the first charge type and an epitaxial layer of the first charge type grown on the semiconductor substrate, wherein the active area is formed in the epitaxial layer and wherein the plurality of non-overlapping doped contact regions corresponds to a plurality of ion-implanted regions of the second charge type.

18. The method according to claim 12, wherein the annealing temperature corresponding to the third annealing conditions is lower than the annealing temperature corresponding to the first annealing conditions.

19. The method according to claim 18, wherein the annealing temperature corresponding to the fourth annealing conditions is higher than the annealing temperature corresponding to the first annealing conditions.

20. The method according to claim 19, wherein the semiconductor body comprises a semiconductor substrate of the first charge type and an epitaxial layer of the first charge type grown on the semiconductor substrate, wherein the active area is formed in the epitaxial layer and wherein the plurality of non-overlapping doped contact regions corresponds to a plurality of ion-implanted regions of the second charge type.

* * * * *